United States Patent
Han

(10) Patent No.: US 6,511,880 B2
(45) Date of Patent: Jan. 28, 2003

(54) CAPACITOR OF A SEMICONDUCTOR DEVICE AND METHOD OF MANUFACTURING THE SAME

(75) Inventor: Seung Kyu Han, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 10/011,122

(22) Filed: Dec. 7, 2001

(65) Prior Publication Data

US 2002/0058376 A1 May 16, 2002

(30) Foreign Application Priority Data

Dec. 11, 2000 (KR) .............................. 00-75144

(51) Int. Cl.$^7$ .......................................... H01L 21/8242
(52) U.S. Cl. ..................... 438/253; 438/396; 438/393; 438/250; 438/397; 438/254
(58) Field of Search ................. 438/239–256, 438/393–399

(56) References Cited

U.S. PATENT DOCUMENTS

| 4,794,302 | A | * | 12/1988 | Nire et al. ................... 313/113 |
| 5,589,733 | A | * | 12/1996 | Noda et al. .................. 313/498 |
| 6,036,823 | A | * | 3/2000 | Inoguchi et al. ........ 204/192.15 |
| 6,340,622 | B1 | * | 1/2002 | Lee et al. ................... 438/240 |

* cited by examiner

*Primary Examiner*—John F. Niebling
*Assistant Examiner*—Jennifer M. Kennedy
(74) *Attorney, Agent, or Firm*—Ladas & Parry

(57) ABSTRACT

A capacitor of a semiconductor device and the method of manufacture thereof, includes the steps of providing a semiconductor substrate; forming a lower electrode on the semiconductor substrate; forming a nitride layer on the upper part of the lower electrode; forming an oxide tin layer $SnO_2$ on the upper part of the nitride layer; forming an amorphous TaON layer on the upper part of the oxide tin layer; diffusing oxygen and tin in the oxide tin layer and amorphous TaON layer by thermal treatment, thereby changing the layers into Ta—C—Sn layer; and forming an upper electrode on the upper part of the Ta—O—Sn layer.

35 Claims, 3 Drawing Sheets

CAPACITOR OF A SEMICONDUCTOR DEVICE AND METHOD OF MANUFACTURING THE SAME

BACKGROUND OF THE INVENTION

1. Field of the Invention

The present invention relates generally to a capacitor of a semiconductor device, and more particularly to, a capacitor of a semiconductor device capable of having high capacitance and reduced leakage current, and the method of manufacture thereof.

2. Description of the Related Art

As the memory cells of DRAM devices are increased, the areas allotted for each memory cell decreases. Therefore, memory cells are required to form a capacitor having a large capacitance to provide accurate data read while occupying a small area.

The capacitance of a capacitor is increased by using an insulating layer having a high dielectric constant as a dielectric layer or by enlarging the surface area of the capacitor. Recent highly-integrated DRAM semiconductor devices provide sufficient capacitance by using a TaON layer as the dielectric layer.

The conventional capacitor of a semiconductor device and the method of manufacture thereof will be described with reference to FIG. 1.

FIG. 1 is a cross-sectional view showing a capacitor of a semiconductor device and the method of manufacture thereof according to the prior art.

Referring to FIG. 1, first, an interlayer insulating layer 3 is formed on a semiconductor substrate 1 having a transistor (not shown) thereon. The interlayer insulating layer is selectively removed, thereby forming a plug contact hole 5 to expose a part of the junction area of the transistor (not shown).

A doped polysilicon layer is deposited to be in contact with the exposed junction area (not shown) on the interlayer insulating layer 3 including the plug contact hole 5. Then, a contact plug 7 is formed in the plug contact hole 5 by selectively removing the doped polysilicon layer.

Subsequently, a doped polysilicon layer is deposited and selectively patterned on the interlayer insulating layer 3 including the contact plug 7 to form a lower electrode 9. The lower electrode 9 may be formed in a shape of a cylinder, pin or stack. The surface of lower electrode 9 is subjected to an in-situ plasma or HF cleaning process to prevent the formation of natural oxide layers.

TaON layers 11 are then formed on the surfaces of the lower electrode 9 and the interlayer insulating layer 3 as dielectric layers. The TaON layer 11 is formed by mutual surface chemical reaction between Ta chemical vapor, $NH_3$ gas and $O_2$ gas, wherein the Ta chemical vapor is obtained by evaporating a precursor such as $Ta(OC_2H_5)_5$.

The TaON layer 11 is crystallized by performing a thermal treatment at a predetermined temperature.

Finally, an upper electrode 13 is formed on the upper part of the TaON layer 11, thereby completing a capacitor of a semiconductor device. Here, the upper electrode 13 is formed with metal materials such as TiN, TaN, W, WN, Wsi, Ru, $RuO_2$, Ir, $IrO_2$ and Pt.

In the resultant capacitor, the TaON layer 11 has a high dielectric constant of approximately 20 to 25, and at the same time, a low oxidation reaction property since it comprises a stable combination of Ta—O—N. Therefore, it is possible to prevent the generation of natural oxide layers and increase of thickness of the dielectric layer in the following thermal treatment.

However, a capacitor and the method of manufacture according to the conventional art have several problems due to the fact that the lower electrode is formed with a doped polysilicon layer.

As is well-known, the doped polysilicon layer has an improved oxidation reaction property. Therefore, the surface of lower electrode is naturally oxidized during the thermal treatment to crystallize the TaON layer, thereby causing the generation of natural oxide layers.

The natural oxide layers comprise $SiO_2$ having a low dielectric constant, thereby increasing the thickness of dielectric layer and lowering the dielectric property. As a result, capacitance is decreased.

A method has been proposed to decrease the thickness of the dielectric layer $T_{ox}$, to solve the problems. However, according to this method, leakage current is increased and performance of the capacitor is lowered.

SUMMARY OF THE INVENTION

The present invention solves the above problems and has as an object to provide a capacitor of a semiconductor device capable of having high capacitance and reduced leakage current.

In order to accomplish this object, one embodiment of the present invention comprises the steps of: providing a semiconductor substrate; forming a lower electrode on the semiconductor substrate; forming a Ta—O—Sn layer on the lower electrode; and forming an upper electrode on the Ta—O—Sn layer.

Another embodiment present invention comprises the steps of: providing a semiconductor substrate; forming a lower electrode on the semiconductor substrate; forming a nitride layer on the lower electrode; forming an oxide tin layer on the nitride layer; forming an amorphous TaON layer on the oxide tin layer; diffusing oxygen and tin in the oxide tin layer and the amorphous TaON layer by thermal treatment process, thereby changing the layers into a Ta—O—Sn layer; and forming an upper electrode on the Ta—O—Sn layer.

Yet another embodiment of the present invention comprises the steps of: providing a semiconductor substrate; forming an interlayer insulating layer on the semiconductor substrate and selectively patterning the interlayer insulating layer to form a first contact hole; forming a contact plug in the first contact hole; forming a cap oxide layer on the interlayer insulating layer including the contact plug; selectively removing the cap oxide layer to expose the contact plug to form a second contact hole; forming a conductive material layer on the cap oxide layer including the second contact hole; selectively removing the conductive material layer until the cap oxide layer is exposed to form a low electrode; removing the cap oxide layer and forming a nitride layer on the resultant structure; forming an oxide tin layer on the upper part of the nitride layer; forming an amorphous TaON layer on the upper part of the oxide tin layer; diffusing oxygen and tin in the amorphous TaON layer and oxide tin layer by thermal treatment process, thereby changing the layers into a Ta—O—Sn layer; and forming an upper electrode on the upper part of the Ta—O—Sn layer.

Still another embodiment of a capacitor of the semiconductor device according to the present invention comprises:

a semiconductor substrate; a lower electrode formed on the semiconductor substrate; a crystallized TaON layer formed on the lower electrode; a Ta—O—Sn layer formed on the crystallized TaON layer; and an upper electrode formed on the Ta—O—Sn layer.

DESCRIPTION OF THE PREFERRED EMBODIMENTS

A description of the preferred embodiment according to the present invention will be described in detail, with reference to the accompanying drawings.

FIGS. 2 to 5 are cross-sectional views showing a method of manufacturing a capacitor for a semiconductor device according to the present invention.

Figure 1:
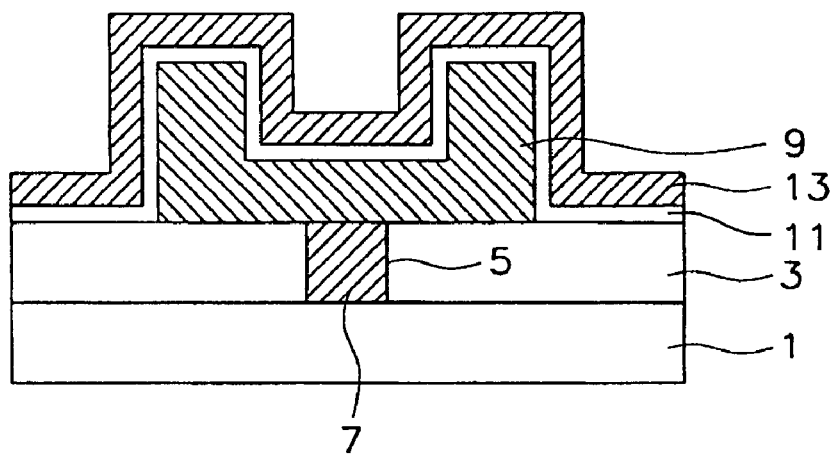
FIG. 1 is a cross-sectional view showing a capacitor of a conventional semiconductor device and the method of manufacture thereof.
Figure 2:
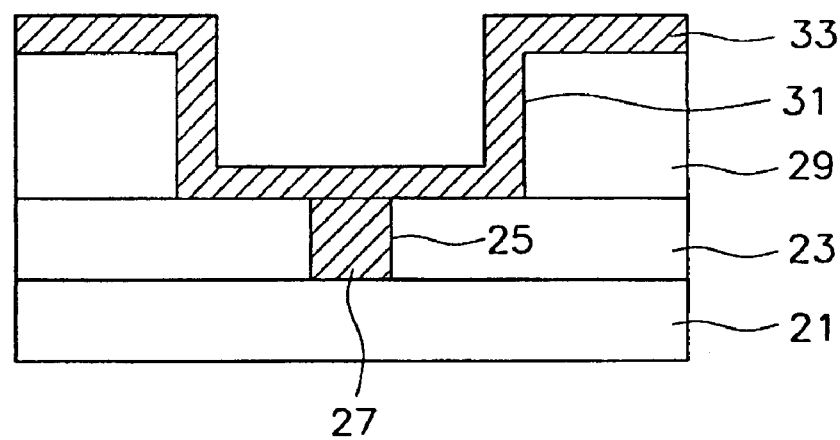
FIGS. 2 to 5 are cross-sectional views showing a capacitor of a semiconductor device and the method of manufacture thereof according to the present invention.

As shown in FIG. 2, an interlayer insulating layer 23 is formed on a semiconductor substrate 21 having a transistor (not shown) thereon and then selectively removed to form a plug contact hole 25 exposing a part of the junction area of the transistor (not shown).

A doped polysilicon layer is deposited to be in contact with the exposed junction area (not shown) on the interlayer insulating layer 23 including the plug contact hole 25 and then selectively removed to form a contact plug 27 in the plug contact hole 25.

A cap oxide layer 29 is then deposited on the interlayer insulating layer 23, including the contact plug 27, and then selectively removed by a mask process using photolithography and by an etch process to form a lower electrode contact hole 31 exposing a predetermined part of the contact plug 27 and of the interlayer insulating layer 23.

A doped polysilicon layer 33 is then deposited on the upper part of the cap oxide layer 29, including on the lower electrode contact hole 31.

Figure 3:
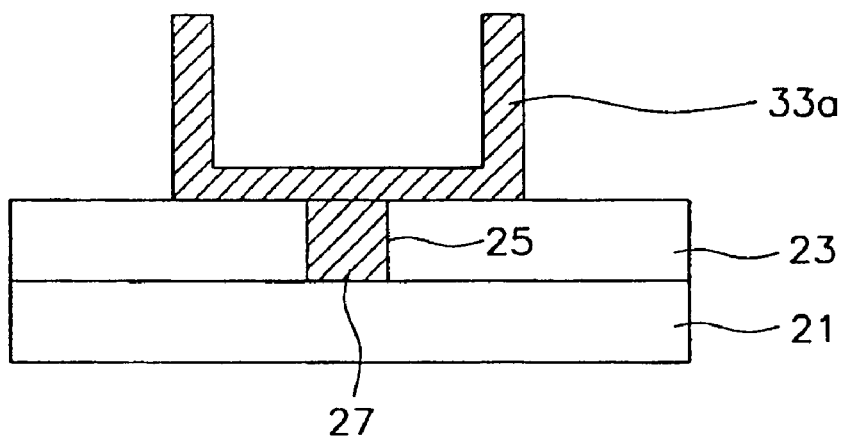

Referring to FIG. 3, the doped polysilicon layer 33 is planarized in accordance with CMP until the upper part of the cap oxide layer 29 is exposed.

A lower electrode 33a of the cylinder structure is formed by removing the cap oxide layer 29 in accordance with a wet etch process and cleaned using a HF or BOE solution.

Figure 4:
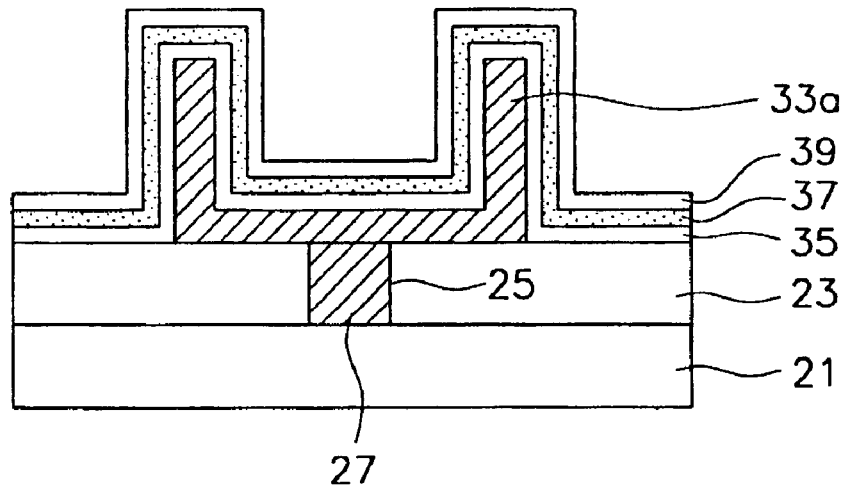

Referring to FIG. 4, a nitride layer 35 is deposited on the resultant structure formed on the lower electrode 33a. In order to prevent generation of a $SiO_2$ layer having a low dielectric constant between the TaON layer and the polysilicon of the lower electrode 33a in the following thermal treatment, a nitride layer 35 is formed in a CVD chamber maintained at a temperature of from 300 to 450° C. with $NH_3$ gas supplied at a flow rate of from 50 to 150 sccm and plasma having RF power of from 50 to 300 W applied for 30 seconds to 1 minute. The nitride layer 35 may also be formed at a temperature of from 600 to 900° C. in an atmosphere of $NH_3$ gas using a Rapid Thermal Process (RTP) and furnace thermal treatment.

An oxide tin layer $SnO_2$ 37 having low oxide generation Gibbs free energy is then deposited on the upper part of the nitride layer 35. The oxide tin layer 37 is formed in a chamber maintaining a temperature of 300 to 500° C. and a pressure of from 0.2 to 1 torr by mutual surface chemical reaction between Sn chemical vapor and $O_2$ gas. The Sn chemical vapor is obtained by extracting a predetermined amount of Sn compound from $SnEt_4$ through a flow controller and evaporating the extracted Sn compound in an evaporator maintaining a temperature of 150 to 200° C. $O_2$ gas is injected into the chamber at a flow rate of 200 to 400 sccm through a flow controller.

An amorphous TaON layer 39 having a high dielectric constant is then deposited on the upper part of the oxide tin layer 37. The TaON layer 39 is formed through a surface chemical reaction by supplying Ta chemical vapor and $NH_3$ gas into a chamber maintaining a temperature of from 350 to 450° C. at a flow rate of from 25 to 200 sccm. The Ta chemical vapor is obtained by extracting Ta compound from a precursor, $Ta(OC_2H_5)_5$, through a flow controller and evaporating the extracted Ta compound in an evaporator at a temperature of from 160 to 190° C.

Figure 5:
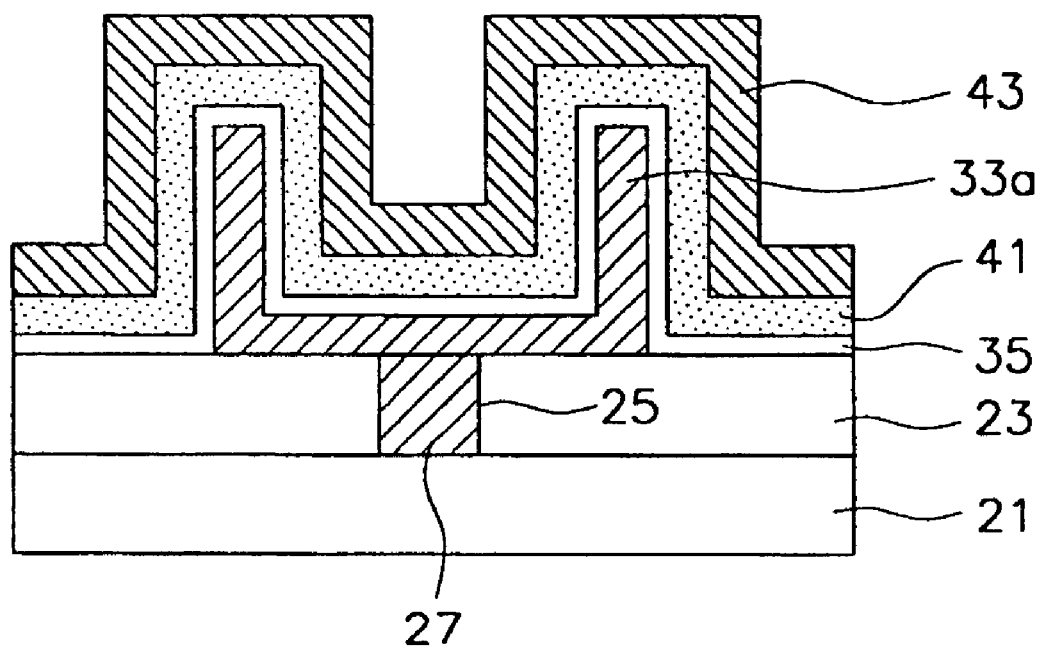

Referring to FIG. 5, the resultant structure is subjected to thermal treatment, thereby forming a new Ta—O—Sn layer 41. The Ta—O—Sn layer 41 is formed by diffusing $O_2$ and Sn in a second following thermal treatment for a double layer of $TaON/SnO_2$. The thermal treatment is performed in a chamber at a temperature of from 600 to 800° C. and in an atmosphere of $N_2O$ and $O_2$ for 30 seconds to 1 hour by using a batch-type furnace and RTP.

The plasma thermal treatment may be performed at a temperature of 350 to 450° C. and at a pressure of 0.8 to 2 torr in-situ after the amorphous TaON layer 39 is deposited. The plasma thermal treatment is performed in a chamber supplied with $O_2$ gas and $N_2$ gas at a flow rate of from 50 to 200 sccm and applied at an RF power of from 30 to 300 w.

Subsequently, an upper electrode 43 is deposited on the upper part of the Ta—O—Sn layer 41, thereby completing a capacitor of a semiconductor device. The upper electrode is formed with a metal material such as TiN, TaN, W, WN, WSi, Ru, $RuO_2$, Ir, $IrO_2$ or Pt. The upper electrode 43 may be formed as a stacked structure with a TiN layer and polysilicon layer. Here, the TiN layer is deposited by flowing $NH_3$ gas with a $TiCl_4$ base. The TiN chemical vapor is obtained by supplying $TiCl_4$ at a predetermined flow rate into an evaporator and then evaporating a predetermined amount at a temperature of 150 to 200° C. Then, $NH_3$ gas is supplied with a flow rate of from 10 to 1000 sccm into a chamber at a temperature of from 300 to 600° C. with the resultant chemical vapor and the TiN layer formed by a surface chemical reaction between them.

In the above preferred embodiment, the lower electrode is formed in the shape of a cylinder. However, it is also possible to form the lower electrode in a pin shape or in a stacked shape.

And, in the above preferred embodiment, the lower electrode is a polysilicon layer. However, a capacitor of a semiconductor device according to the present invention can be obtained by forming a Meta-stable Poly Silicon MPS structure with amorphous silicon layer.

As describe above, according to the present invention, an oxide tin layer $SnO_2$, having a low oxide generation Gibbs free energy, is deposited before a TaON layer is deposited. A binary source of oxygen is obtained by the following thermal treatment, thereby improving the chemical composition rate of the TaON layer and leakage current properties thereof.

Moreover, $O_2$ and Sn are diffused by the following thermal treatment for a double layer of $TaON/SnO_2$, thereby forming Ta—O—Sn. As a result, it is effective in improving the dielectric constant.

Although the preferred embodiments of the invention have been disclosed for illustrative purposes, those skilled in the art will appreciate that various modifications, additions and substitutions are possible, without departing from the scope and spirit of the invention as disclosed in the accompanying claims.

What is claimed is:

1. A method of manufacturing a capacitor of a semiconductor device comprising the steps of:
    providing a semiconductor substrate;
    forming a lower electrode on the semiconductor substrate;
    forming a Ta—O—Sn layer on the lower electrode by performing the following substeps:
        forming an oxide tin layer on the lower electrode,
        forming an amorphous TaON layer on the oxide tin layer, and
        providing a thermal treatment to form a Ta—O—Sn layer by diffusing
            oxygen and tin in the amorphous TaON layer and the oxide tin layer; and
    forming an upper electrode on the Ta—O—Sn layer.

2. The method of manufacturing a capacitor of a semiconductor device according to claim 1, further comprising a step of forming a nitride layer on the lower electrode.

3. The method of manufacturing a capacitor of a semiconductor device according to claim 2, wherein the nitride layer is formed by supplying $NH_3$ gas at a flow rate of 50 to 150 sccm into a CVD chamber maintaining a temperature of from 300 to 450° C. and by applying a plasma of Re power ranging from 50 to 300 W for 30 seconds to 1 minute.

4. The method of manufacturing a capacitor of a semiconductor device according to claim 2, wherein the nitride layer is formed at a temperature of 600 to 900° C. in an atmosphere of $NH_3$ gas by using either a RTP or furnace thermal treatment.

5. The method of manufacturing a capacitor of a semiconductor device according to claim 1, wherein the oxide tin layer is formed in a chamber maintaining a temperature of from 300 to 500° C. and a pressure of from 0.2 to 1 torr by using a surface chemical reaction between a Sn chemical vapor and an $O_2$ gas.

6. The method of manufacturing a capacitor of a semiconductor device according to claim 5, wherein the Sn chemical vapor is obtained by extracting Sn compound from $SnEt_4$ through a flow controller and then by evaporating the extracted Sn compound in an evaporator maintaining a temperature of from 150 to 200° C.

7. The method of manufacturing a capacitor of a semiconductor device according to claim 5, wherein the $O_2$ gas is injected into the chamber at a flow rate of from 200 to 400 sccm through a flow controller.

8. The method of manufacturing a capacitor of a semiconductor device according to claim 5, wherein the amorphous TaON layer is formed through a surface chemical reaction generated by supplying Ta chemical vapor and $NH_3$ gas at a flow rate of from 25 to 200 sccm into the chamber maintaining a temperature of from 350 to 450° C.

9. The method of manufacturing a capacitor of a semiconductor device according to claim 8, wherein the Ta chemical vapor is obtained by extracting a predetermined amount of Ta compound from a precursor, $Ta(OC_2H_5)_5$, through a flow controller and then by evaporating the extracted Ta compound in an evaporator maintaining a temperature of from 160 to 190° C.

10. The method of manufacturing a capacitor of a semiconductor device according to claim 5, wherein the thermal treatment is performed at a temperature of from 600 to 800° C. in an atmosphere of $N_2O$ and $O_2$ for 30 seconds to 1 hour by using either a batch type furnace or RTP.

11. The method of manufacturing a capacitor of a semiconductor device according to claim 5, wherein the thermal treatment is performed at a temperature of from 350 to 450° C. at a pressure of from 0.8 to 2 torr in-situ with a plasma thermal treatment after the amorphous TaON layer is deposited.

12. The method of manufacturing a capacitor of a semiconductor device according to claim 11, wherein the plasma thermal treatment is performed by applying a RF power of from 30 to 300W in a chamber supplied with $O_2$ gas and $N_2$ gas at a flow rate of from 50 to 200 sccm.

13. The method of manufacturing a capacitor of a semiconductor device according to claim 1, wherein the upper electrode is formed as a stacked structure of a TiN layer and doped polysilicon layer, or as a stacked structure of a polysilicon layer and MPS, or by selectively combining one or more metal materials such as TiN, TaN, W, WN, WSi, Ru, $RuO_2$, Ir, $IrO_2$ and Pt.

14. The method of manufacturing a capacitor of a semiconductor device according to claim 1, wherein the lower electrode is formed in the shape of a cylindrical structure, a pin structure or a stacked structure.

15. The method of manufacturing a capacitor of a semiconductor device comprising the steps of:
    providing a semiconductor substrate;
    forming a lower electrode on the semiconductor substrate;
    forming a nitride layer on the lower electrode;
    forming an oxide tin layer on the nitride layer;
    forming an amorphous TaON layer on the oxide tin layer;
    diffusing oxygen and tin in the oxide tin layer and in the amorphous TaON layer by a thermal treatment, thereby changing the oxide tin layer and the amorphous TaON layer into a Ta—O—Sn layer; and
    forming an upper electrode on the Ta—O—Sn layer.

16. The method of manufacturing a capacitor of a semiconductor device according to claim 15, wherein the nitride layer is formed by supplying $NH_3$ gas at a flow rate of 50 to 150 sccm into a CVD chamber at a temperature of from 300 to 450° C. and applying a plasma of RF power of from 50 to 300W.

17. The method of manufacturing a capacitor of a semiconductor device according to claim 15, wherein the oxide tin layer is formed by a surface chemical reaction between Sn chemical vapor and $O_2$ gas in a chamber maintaining a temperature of from 300 to 500° C. and a pressure of from 0.2 to 1 torr.

18. The method of manufacturing a capacitor of a semiconductor device according to claim 15, wherein the amorphous TaON layer is formed by supplying Ta chemical vapor and $NH_3$ gas at a flow rate of from 25 to 200 sccm into a chamber at a temperature of from 350 to 450° C., thereby causing a surface chemical reaction between them.

19. The method of manufacturing a capacitor of a semiconductor device according to claim 15, wherein the thermal treatment is performed at a temperature of from 600 to 800° C. in an atmosphere of $N_2O$ and $O_2$ for 30 seconds to 1 hour by using either a batch-type furnace or RTP.

20. The method of manufacturing a capacitor of a semiconductor device according to claim 15, wherein the thermal treatment is performed at a temperature of from 350 to 450° C. and at a pressure of from 0.8 to 2 torr in-situ with a plasma thermal treatment after the amorphous TaON layer is deposited.

21. The method of manufacturing a capacitor of a semiconductor device according to claim 15, wherein the upper electrode may be formed as a stacked structure of a TiN layer and doped polysilicon layer, or as a stacked structure of a polysilicon layer and MPS, or by selectively combining one or more metal materials such as TiN, TaN, W, WN, WSi, Ru, $RuO_2$, Ir, $IrO_2$ and Pt.

22. The method of manufacturing a capacitor of a semiconductor device according to claim 15, wherein the lower electrode is formed as a cylindrical structure, a pin structure or a stacked structure.

23. The method of manufacturing a capacitor of a semiconductor device comprising the steps of:
   providing a semiconductor substrate;
   forming an interlayer insulating layer on the semiconductor substrate;
   selectively patterning an interlayer insulating layer to form a first contact hole;
   forming a contact plug in the first contact hole;
   forming a cap oxide layer on the interlayer insulating layer including the contact plug;
   selectively removing the cap oxide layer to form a second contact hole exposing the contact plug;
   forming a conductive material layer on the cap oxide layer including the second contact hole;
   selectively removing the conductive material layer until the cap oxide layer is exposed to form a lower electrode;
   removing the cap oxide layer and then forming a nitride layer on the resultant structure;
   forming an oxide tin layer on the upper part of the nitride layer;
   forming an amorphous TaON layer on the upper part of the oxide tin layer;
   diffusing oxygen and tin in the amorphous TaON layer and the oxide tin layer by thermal treatment, thereby changing the layers into a Ta—O—Sn layer; and
   forming an upper electrode on the Ta—O—Sn layer.

24. The method of manufacturing a capacitor of a semiconductor device according to claim 23, wherein the nitride layer is formed by supplying $NH_3$ gas at a flow rate of from 50 to 150 sccm into a CVD chamber at a temperature of from 300 to 450° C. and applying a plasma of RF power of from 50 to 300W for 30 seconds to 1 minute.

25. The method of manufacturing a capacitor of a semiconductor device according to claim 23, wherein the nitride layer is formed at a temperature of 600 to 900° C. in an atmosphere of $NH_3$ gas by using either a RTP or furnace thermal treatment.

26. The method of manufacturing a capacitor for a semiconductor device according to claim 23, wherein the oxide tin layer is formed by a surface chemical reaction between Sn chemical vapor and $O_2$ gas in a chamber maintaining a temperature of from 300 to 500° C. and a pressure of from 0.2 to 1 torr.

27. The method of manufacturing a capacitor of a semiconductor device according to claim 23, wherein the amorphous TaON layer is formed by supplying Ta chemical vapor and $NH_3$ gas at a flow rate of from 25 to 200 sccm into a chamber at a temperature of from 350 to 450° C., thereby causing a surface chemical reaction between them.

28. The method of manufacturing a capacitor of a semiconductor device according to claim 23, wherein the thermal treatment is performed at a temperature of 600 to 800° C. in an atmosphere of $N_2O$ and $O_2$ for 30 seconds to 1 hour by using either a batch-type furnace or RTP.

29. The method of manufacturing a capacitor of a semiconductor device according to claim 23, wherein the thermal treatment is performed at a temperature of 350 to 450° C. and at a pressure of 0.8 to 2 torr in-situ with a plasma thermal treatment after the amorphous TaON layer is deposited.

30. The method of manufacturing a capacitor of a semiconductor device according to claim 23, wherein the upper electrode may be formed as a stacked structure of a TiN layer and doped polysilicon layer, or as a stacked structure of polysilicon layer and MPS, or by selectively combining one or more metal materials such as TiN, TaN, w, WN, WSi, Ru, $RuO_2$, Ir, $IrO_2$ and Pt.

31. The method of manufacturing a capacitor of a semiconductor device according to claim 23, wherein the lower electrode is formed as a cylindrical structure, a pin structure or a stacked structure.

32. A method of manufacturing a capacitor of a semiconductor device comprising:
   providing a semiconductor substrate;
   forming a lower electrode on the lower electrode;
   forming an oxide tin layer $SnO_2$ on the lower electrode;
   forming a crystallized Ta—O—Sn layer on the oxide tin layer applying a thermal treatment at a predetermined temperature; and
   forming an upper electrode on the crystallized Ta—O—Sn layer.

33. The method of manufacturing a capacitor of a semiconductor device according to claim 32, wherein the upper electrode may be formed as a stacked structure of a TiN layer and doped polysilicon layer or as a stacked structure of a doped polysilicon layer and MPS.

34. The method of manufacturing a capacitor of a semiconductor device according to claim 32, wherein the lower electrode is formed as a cylindrical structure, a pin structure or a stacked structure.

35. The method of manufacturing a capacitor of a semiconductor device according to claim 32, wherein the nitride layer is formed by supplying $NH_3$ gas at a flow rate of 50 to 150 sccm into a CVD chamber by using either a RTP or furnace thermal treatment at a temperature of 600 to 900° C. in an atmosphere of $NH_3$.

* * * * *